United States Patent
Yan et al.

(10) Patent No.: US 11,342,367 B2
(45) Date of Patent: May 24, 2022

(54) PHOTOSENSITIVE DETECTOR, IMAGING SENSOR CHIP FORMED USING THE PHOTOSENTIVE DETECTOR, AND DETECTION METHOD

(71) Applicant: NANJING UNIVERSITY, Jiangsu (CN)

(72) Inventors: Feng Yan, Jiangsu (CN); Zhijian Huang, Jiangsu (CN); Yi Shi, Jiangsu (CN); Haowen Ma, Jiangsu (CN); Yuqian Li, Jiangsu (CN); Xiaofeng Bu, Jiangsu (CN); Xiangshun Kong, Jiangsu (CN); Cheng Mao, Jiangsu (CN); Cheng Yang, Jiangsu (CN); Limin Zhang, Jiangsu (CN)

(73) Assignee: NANJING UNIVERSITY, Jiangsu (CN)

( * ) Notice: Subject to any disclaimer, the term of this patent is extended or adjusted under 35 U.S.C. 154(b) by 206 days.

(21) Appl. No.: 16/652,870

(22) PCT Filed: Mar. 23, 2018

(86) PCT No.: PCT/CN2018/080182
§ 371 (c)(1),
(2) Date: Apr. 1, 2020

(87) PCT Pub. No.: WO2019/085374
PCT Pub. Date: May 9, 2019

(65) Prior Publication Data
US 2020/0251515 A1    Aug. 6, 2020

(30) Foreign Application Priority Data
Oct. 30, 2017 (CN) .......................... 201711033195.X

(51) Int. Cl.
*H01L 27/14* (2006.01)
*H01L 27/146* (2006.01)
(Continued)

(52) U.S. Cl.
CPC ........ *H01L 27/14614* (2013.01); *G03B 7/093* (2013.01); *H01L 27/14609* (2013.01); *H01L 27/14625* (2013.01); *H04N 5/3745* (2013.01)

(58) Field of Classification Search
CPC ......... H01L 27/14614; H01L 27/14609; H01L 27/14625; H01L 27/14634; H01L 21/82;
(Continued)

(56) References Cited

U.S. PATENT DOCUMENTS

| | | | | |
|---|---|---|---|---|
| 2009/0256211 A1* | 10/2009 | Booth, Jr. | ....... | H01L 21/823842 257/407 |
| 2016/0163758 A1* | 6/2016 | Iwasaki | ............... | H01L 27/1462 257/225 |

(Continued)

FOREIGN PATENT DOCUMENTS

| | | |
|---|---|---|
| CN | 102938409 A | 2/2013 |
| CN | 104091813 A | 10/2014 |

(Continued)

*Primary Examiner* — Tony Ko
(74) *Attorney, Agent, or Firm* — Novick, Kim & Lee, PLLC; Allen Xue

(57) ABSTRACT

A photosensitive detector includes an array of detection units, each detection unit having a light-sensing transistor (1), a charge storage transistor (2) and a reading transistor (3), or comprising a light-sensing transistor, a charge transfer transistor (4), a charge storage transistor and a reading transistor. The light-sensing transistor is configured to realize the light-sensing function of the photosensitive detector; the charge storage transistor is configured to store photogenerated charges; the reading transistor is configured to read a signal; and, the charge transfer transistor is configured to control the transfer of the photogenerated charges. The (Continued)

photosensitive detector can realize global shutter and fast reading, and is compatible with the existing floating gate CMOS process, and the failure of any pixel will not affect the normal operation of the whole imaging array.

10 Claims, 10 Drawing Sheets

(51) Int. Cl.
    *G03B 7/093*     (2021.01)
    *H04N 5/3745*     (2011.01)

(58) Field of Classification Search
    CPC .......... H01L 27/14603; H01L 27/1463; H01L 29/51; G03B 7/093; H04N 5/3745
    See application file for complete search history.

(56) References Cited

U.S. PATENT DOCUMENTS

2016/0351709 A1* 12/2016 Nishikawa ........ H01L 27/11556
2017/0287947 A1* 10/2017 Li ..................... H01L 27/1288

FOREIGN PATENT DOCUMENTS

| CN | 104900667 A | 9/2015 |
| CN | 107180844 A | 9/2017 |

* cited by examiner

US 11,342,367 B2

PHOTOSENSITIVE DETECTOR, IMAGING SENSOR CHIP FORMED USING THE PHOTOSENTIVE DETECTOR, AND DETECTION METHOD

TECHNICAL FIELD OF THE INVENTION

The present invention relates to an imaging device, and in particular to the structure, operating mechanism and signal reading of an imaging detection device applied to the detection of visible light and infrared bands. The present invention is applicable to global-shutter imaging.

BACKGROUND OF THE INVENTION

Imaging devices are widely applied in various fields. At present, main imaging devices include CCDs and CMOS-APSs. The CCDs appear earlier and have a basic structure formed of MOS capacitors connected in series. A pulse bias is applied onto the gate to form a depletion region to collect photoelectrons, and the photoelectrons are then read out in form of charge packets by a pulse sequence. The CCDs have the disadvantages of complicated process, high cost, high power consumption and the like although they are superior to the CMOS sensors in sensitivity, resolution, imaging quality and the like. The CMOS image sensors are compatible with the CMOS processes and thus have lower cost and power consumption than those of the CCDs. The CMOS-APSs sense light by diodes, and each detection unit includes a number of transistors to amplify and read signals. Addressing and signal reading are performed by a peripheral decoding circuit. Just because each detection unit contains a number of transistors, the CMOS-APSs have the disadvantages of small filling coefficient, low sensitivity, high noise and the like.

It can be found from the above comparison that the CCDs and the CMOSs have their own advantages and disadvantages. Accordingly, a dual-transistor photosensitive detector based on a composite dielectric gate MOSFET was proposed in Patent CN201210442007, which solves the disadvantages such as complicated reading mode for the CCDs and small filling coefficient and difficult size reduction for the CMOS-APSs. This detector includes two transistors respectively used for sensing light and reading. However, to ensure that the number of photoelectrons in the detector is not affected by the chronological order of reading, the imaging sensor chip using the array of detectors must use a mechanical shutter. Thus, global shutter cannot be realized, and the range of application of the detector is greatly limited. Therefore, it is necessary to provide a detector with a new structure to overcome this disadvantage, so as to realize Global shutter of the imaging sensor chip.

SUMMARY OF THE INVENTION

To overcome the deficiencies in the prior art, the present invention provides an improved novel imaging device in combination with the principle of CCD charge transfer. In addition to the light sensing, photoelectron collection, reading and resetting functions of the original device, this device also has photoelectron transfer and storage functions. Global shutter can be realized and the filling coefficient and quantum efficiency of pixels can be further improved.

For this purpose, the present invention employs the following technical solutions.

A global-shutter photosensitive detector based on a composite dielectric gate MOSFET is provided, including an array formed of multiple detection units, wherein each detection unit includes a light-sensing transistor, a charge storage transistor and a reading transistor, all of which are stacked above a same P-type semiconductor substrate; the light-sensing transistor is configured to realize the light-sensing function of the photosensitive detector, having a bottom insulating dielectric layer, a charge coupled layer, a top insulating dielectric layer and a control gate stacked above the P-type semiconductor substrate successively from the bottom up, or, a bottom insulating dielectric layer and a control gate stacked above the P-type semiconductor substrate successively from the bottom up; the charge storage transistor is configured to store photogenerated charges, having a bottom insulating dielectric layer, a charge coupled layer, a top insulating dielectric layer and a control gate stacked above the P-type semiconductor substrate successively from the bottom up; the reading transistor is configured to read a signal, having a bottom insulating dielectric layer, a charge coupled layer, a top insulating dielectric layer and a control gate stacked above the P-type semiconductor substrate successively from the bottom up, a N-type source is formed on a side of the P-type semiconductor substrate close to the bottom insulating dielectric layer by ion implantation, and a N-type drain is formed on the other side of the P-type semiconductor substrate close to the bottom insulating dielectric layer and opposite to the N-type source by ion implantation; the charge storage transistor and the reading transistor are isolated by a shallow trench isolation region in the substrate; the charge coupled layer of the light-sensing transistor is not in connection to the charge coupled layer of the charge storage transistor, and the control gate of the light-sensing transistor is not in connection to the control gate of the charge storage transistor; and, the charge coupled layer of the charge storage transistor is in connection to the charge coupled layer of the reading transistor, and the control gate of the charge storage transistor is in connection to the control gate of the reading transistor.

Further, a charge transfer transistor is arranged between the light-sensing transistor and the charge storage transistor to control the transfer of the photogenerated charges; the charge transfer transistor is formed above the P-type semiconductor substrate and has a bottom insulating dielectric layer, a charge coupled layer, a top insulating dielectric layer and a control gate stacked successively from the bottom up; the charge coupled layer of the charge transfer transistor is not in connection to both the charge coupled layer of the light-sensing transistor and the charge coupled layer of the charge storage transistor, and the control gate of the charge transfer transistor is not in connection to both the control gate of the light-sensing transistor and the control gate of the charge storage transistor.

In the array formed of multiple detection units, as a solution, the control gates of the light-sensing transistors in all the detection units are connected to form a word line WL1; the control gates shared by the reading transistors and the charge storage transistors in each row of detection units are connected to form a word line WL3_X; the sources of the reading transistors in each column of detection units are connected to form a source line SL_X; and the drains of the reading transistors in each column of detection units are connected to form a drain line DL_X, where X=0, 1, 2, 3 . . . N. As another solution, the control gates of the light-sensing transistors in all the detection units are connected to form a word line WL1; the control gates of the charge transfer transistors in all the detection units are connected to form a word line WL2; the control gates shared by the reading transistors and the charge storage transistors in each row of detection units are connected to form a word line WL3_X; the sources of the reading transistors in each column of detection units are connected to form a source line SL_X; and the drains of the reading transistors in each column of detection units are connected to form a drain line DL_X, where X=0, 1, 2, 3 . . . N.

An imaging sensor chip formed using the global-shutter photosensitive detector based on a composite dielectric gate MOSFET described above is provided, including an array of detectors, a word line decoded addressing circuit, a source line/drain line decoded addressing circuit, an A/D circuit and an interface circuit, wherein the word line decoded addressing circuit is configured to generate, according to a reading order, different bias signals for each word line in shutter, transfer, read and reset stages of a detector; the source line/drain line decoded addressing circuit is configured to strobe, according to the reading order, a source and a drain of a reading transistor of a detector; the A/D circuit is configured to convert a photoelectronic signal in a photosensitive detector into a digital signal; and, the interface circuit is configured to transmit, under the control of a clock signal, the converted digital signal to the outside of the imaging sensor chip.

A detection method using the global-shutter photosensitive detector based on a composite dielectric gate MOSFET described above is provided, including following steps:

(1) photoelectron collection: applying a positive bias onto a control gate of a light-sensing transistor and a negative bias onto a substrate, and applying a zero bias or positive bias onto a control gate of a charge storage transistor; and connecting a source and a drain of a reading transistor to the ground;

(2) photoelectron transfer and storage: maintaining the positive bias applied onto the control gate of the light-sensing transistor, and applying a positive bias onto the control gate of the charge storage transistor, wherein the positive bias is greater than the positive bias applied onto the control gate of the light-sensing transistor so that photoelectrons collected in a depletion region of the light-sensing transistor are completely transferred to a depletion region of the charge storage transistor; at the end of the transfer of the photoelectrons, applying, onto the control gate of the light-sensing transistor, a negative bias that is the same as that applied to the substrate, so that there is no depletion region in the light-sensing transistor and no photoelectron is collected;

(3) photoelectron reading: connecting the source of the reading transistor to the ground, applying a proper positive bias onto the drain, applying a ramp voltage onto the control gate of the reading transistor, and calculating the number of photoelectrons collected in the light-sensing transistor according to the change in the ramp voltage when the reading transistor is turned on; and (4) resetting: applying, onto the control gate of the light-sensing transistor and the control gate of the charge storage transistor, a negative bias that is the same as that applied to the substrate, and connecting the source and the drain of the reading transistor to the ground, so that the photoelectrons disappear by recombination of photoelectrons and holes.

Another detection method using the global-shutter photosensitive detector based on a composite dielectric gate MOSFET described above is provided, including following steps:

(1) photoelectron collection: applying a positive bias onto a control gate of a light-sensing transistor and a negative bias onto a substrate, and forming a depletion region on a P-type substrate to collect photoelectrons; applying a negative bias onto a control gate of a charge transfer transistor, and applying a zero bias or positive bias onto a control gate of a charge storage transistor; and connecting a source and a drain of a reading transistor to the ground;

(2) photoelectron transfer and storage: maintaining the positive bias applied onto the control gate of the light-sensing transistor, applying a positive bias onto the control gate of the charge transfer transistor, applying a positive bias onto the control gate of the charge storage transistor, so that the electronic potential in a substrate below the light-sensing transistor, the charge transfer transistor and the charge storage transistor decreases progressively and photoelectrons collected in a depletion region of the light-sensing transistor are completely transferred to a depletion region of the charge storage transistor; at the end of the transfer of the photoelectrons, applying a negative bias onto the control gate of the charge transfer transistor, and applying, onto the control gate of the light-sensing transistor, a negative bias that is the same as that applied to the substrate, so that there is no depletion region in the light-sensing transistor and no photoelectron is collected;

(3) photoelectron reading: connecting the source of the reading transistor to the ground, applying a proper positive bias onto the drain, applying a ramp voltage onto the control gate of the reading transistor, and calculating the number of photoelectrons collected in the light-sensing transistor according to the change in the ramp voltage when the reading transistor is turned on; and (4) resetting: applying, onto the control gate of the light-sensing transistor, the control gate of the charge transfer transistor and the control gate of the charge storage transistor, a negative bias that is the same as that applied to the substrate, and connecting the source and the drain of the reading transistor to the ground, so that the photoelectrons disappear by recombination of photoelectrons and holes.

The global-shutter photosensitive detector based on a composite dielectric gate MOSFET provided by the present invention has the following remarkable advantages.

(1) Global shutter and fast reading can be realized without any mechanical shutter.

(2) The detector is compatible with the existing floating gate CMOS processes, mature in manufacturing technology and easy to implement.

(3) Compared with the CCDs and CMOS-APSs, the detector has many advantages of both the CCDs and the CMOS-APSs and also overcomes their disadvantages. For example, in the present invention, the signal from each detection unit can be read by a row/column decoding unit, which is different from the signal reading of mobile charge packets as used for the CCDs. Although there is a photoelectron transfer process after each shutter, photoelectron transfer is performed simultaneously, and reading can be performed immediately after the photoelectron transfer is completed. Therefore, compared with the CCDs, faster reading can be realized.

(4) In the present invention, the array formed of detection units is highly integrated with peripheral circuits, the sensor chip size can be greatly reduced, and it is beneficial to reduce the power consumption. In addition, the failure of any pixel will not affect the normal operation of the whole imaging array.

DETAILED DESCRIPTION OF THE INVENTION

In this embodiment, the global-shutter photosensitive detector has two basic structures, and each detection unit uses three or four transistors. The structure using three transistors includes a light-sensing transistor 1, a charge storage transistor 2 and a reading transistor 3, with the light-sensing transistor 1 being configured to realize the light-sensing function of the photosensitive detector, the charge storage transistor 2 being configured to store photogenerated charges, and the reading transistor 3 being configured to read a signal. The structure using four transistors includes a light-sensing transistor 1, a charge transfer transistor 4, a charge storage transistor 2 and a reading transistor 3, with the charge transfer transistor 4 controlling the transfer the photogenerated charges, and the charge storage transistor 2 being configured to the transferred photoelectrons. The specific structures will be described below.

Figure 1:
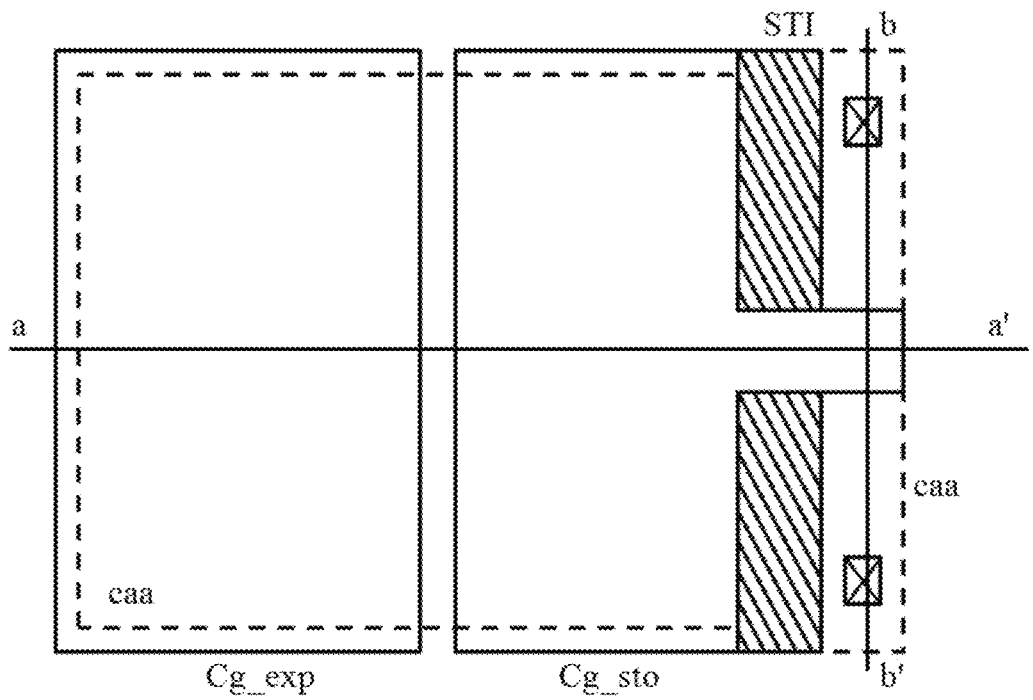
FIG. 1 is a layout diagram of a global-shutter photosensitive detector based on a composite dielectric gate MOSFET, which is formed of three transistors.
Figure 3:
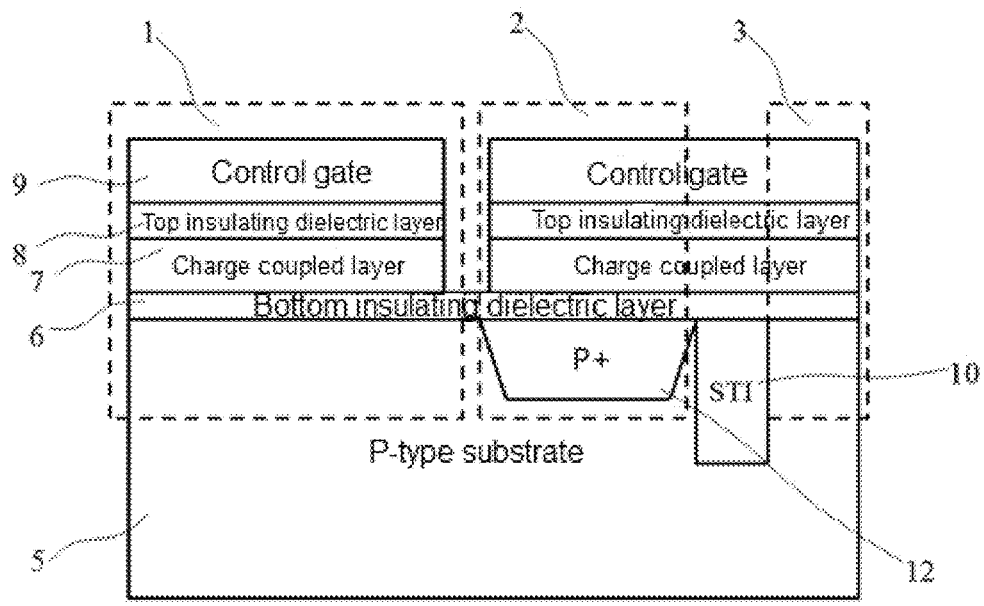
FIG. 3 is a sectional view of FIG. 1 along aa'.
Figure 4:
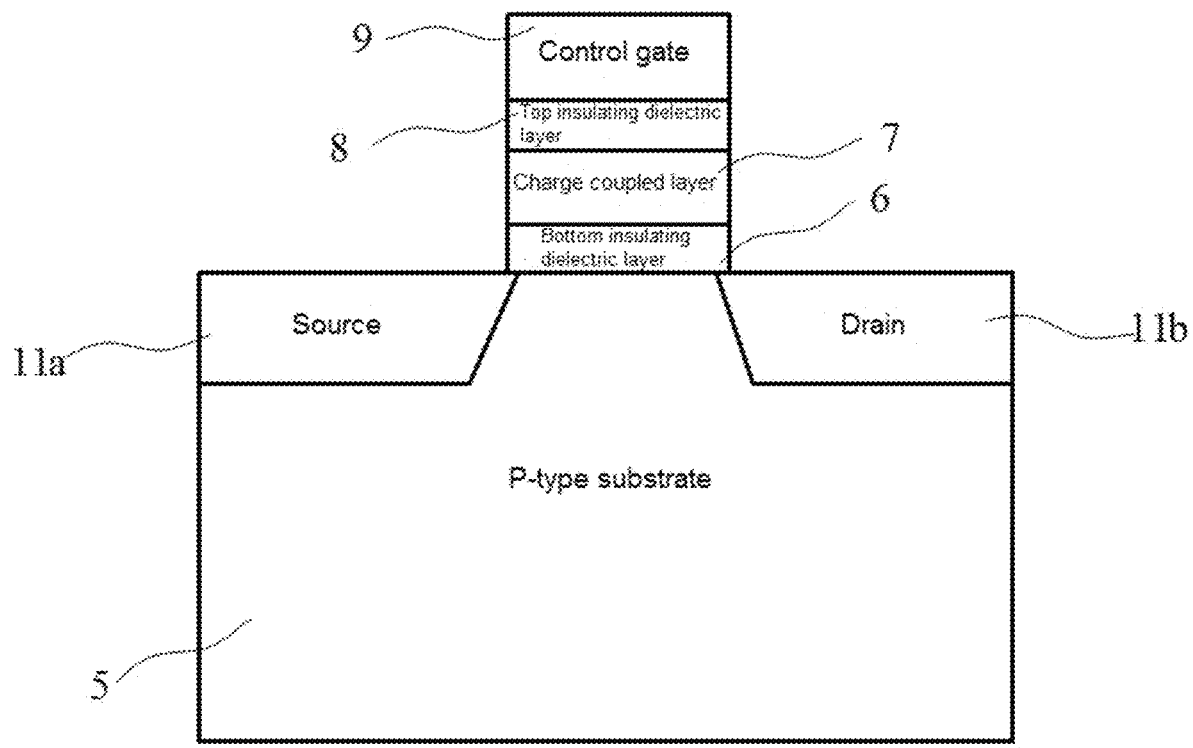
FIG. 4 is a sectional view of FIG. 1 along bb'.

In this embodiment, the layout diagram of the three-transistor (3T) global-shutter photosensitive detector based on a composite dielectric gate MOSFET is shown in FIG. 1, and the sectional views along aa' and bb' are shown in FIGS. 3 and 4, respectively. Each detection unit includes a light-sensing transistor 1, a charge storage transistor 2 and a reading transistor 3 which are stacked above a P-type semiconductor substrate 5 successively. A bottom insulating dielectric layer 6, a charge coupled layer 7, a top insulating dielectric layer 8 and a control gate 9 are stacked above the P-type semiconductor substrate 5 successively from the bottom up. In the global-shutter photosensitive detector, the charge coupled layers 7 and the control gates 9 of the light-sensing transistor 1 and the charge storage transistor 2 are exposed by etching. The charge coupled layers 7 and the control gates 9 of the charge storage transistor 2 and the reading transistor 3 in the global-shutter photosensitive detector are connected to read photoelectronic signals stored in the charge storage transistor 2 by charge coupling. The P-type semiconductor substrate 5 below the charge storage transistor 2 and the reading transistor 3 is isolated by a shallow trench isolation (STI) region 10. For the reading transistor 3, a N-type source 11a is formed on a side of the P-type semiconductor substrate 5 close to the bottom insulating dielectric layer 6 by ion implantation, and a N-type drain 11b is formed on the other side of the P-type semiconductor substrate 5 close to the bottom insulating dielectric layer 6 and opposite to the N-type source 11a by ion implantation. The light-sensing transistor 1 and the charge storage transistor 2 may be the same or different in area. A P-type heavily-doped region 12 is formed on the P-type semiconductor substrate 5 below the charge storage transistor 2 by P+ ion implantation, to increase the full-well charge capacity, decrease the area of the charge storage transistor 2, increase the filling coefficient of pixels and isolate the electrons from the light-sensing transistor 1 from the electrons collected in the P-type semiconductor substrate 5.

Figure 2:
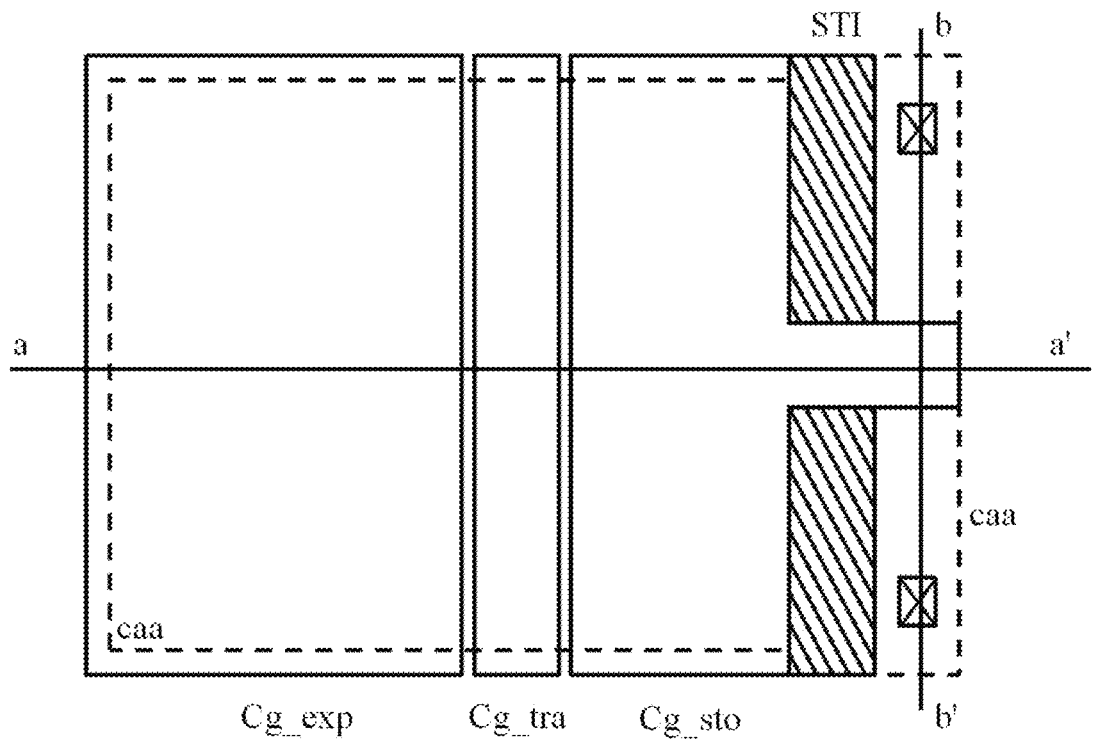
FIG. 2 is a layout diagram of a global-shutter photosensitive detector based on a composite dielectric gate MOSFET, which is formed of four transistors.
Figure 5:
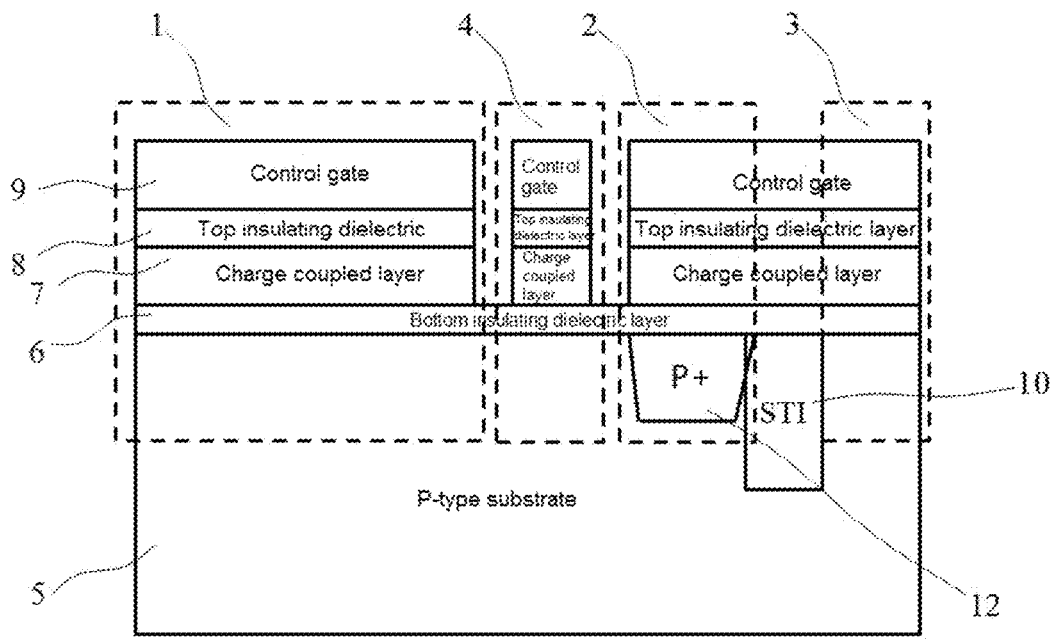
FIG. 5 is a sectional view of FIG. 2 along aa'.
Figure 6:
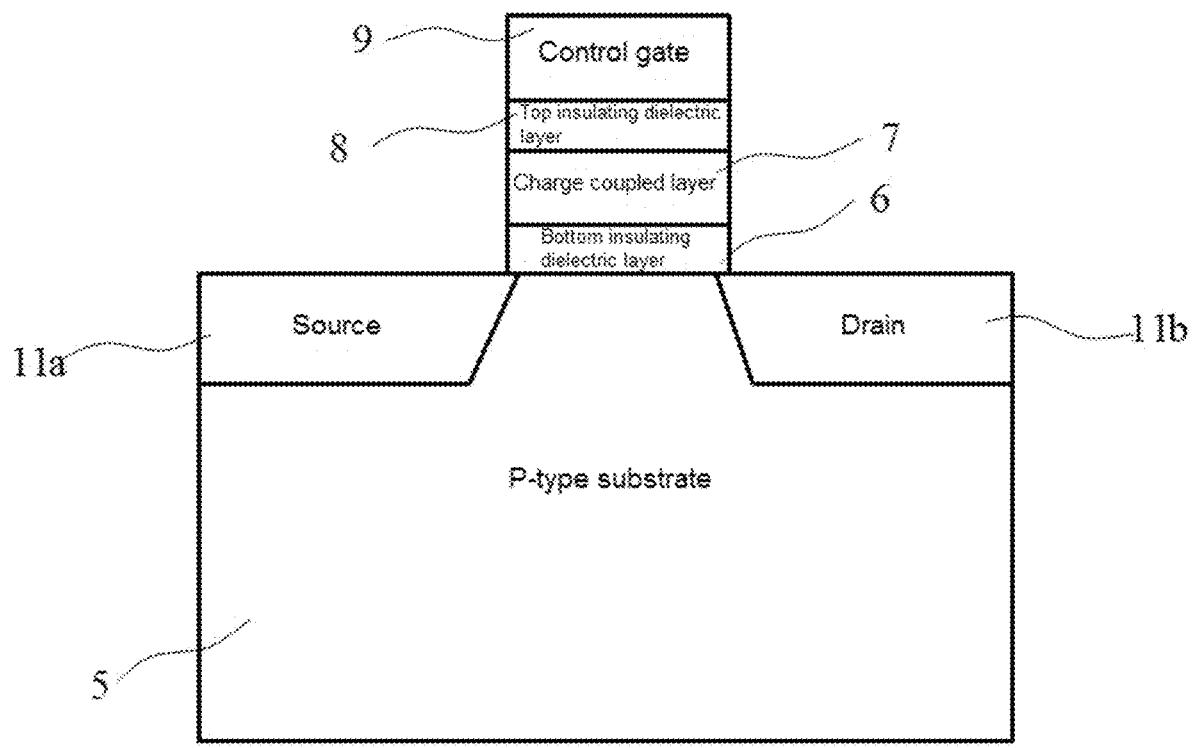
FIG. 6 is a sectional view of FIG. 2 along bb'.

In this embodiment, the layout diagram of the four-transistor (4T) global-shutter photosensitive detector based on a composite dielectric gate MOSFET is shown in FIG. 2, and the sectional views along aa' and bb' are shown in FIGS. 5 and 6, respectively. Each detection unit includes a light-sensing transistor 1, a charge transfer transistor 4, a charge storage transistor 2 and a reading transistor 3 which are stacked above a P-type semiconductor substrate 5 successively. A bottom insulating dielectric layer 6, a charge coupled layer 7, a top insulating dielectric layer 8 and a control gate 9 are stacked above the P-type semiconductor substrate 5 successively from the bottom up. In the global-shutter photosensitive detector, the charge coupled layers 7 and the control gates 9 of the charge transfer transistor 4 and the charge storage transistor 2 are exposed by etching. The charge coupled layers 7 and the control gates 9 of the charge storage transistor 2 and the reading transistor 3 in the global-shutter photosensitive detector are connected to read photoelectronic signals stored in the charge storage transistor 2 by charge coupling. The P-type semiconductor substrate 5 below the charge storage transistor 2 and the reading transistor 3 is isolated by a shallow trench isolation (STI) region 10. For the reading transistor 3, a N-type source 11a is formed on a side of the P-type semiconductor substrate 5 close to the bottom insulating dielectric layer 6 by ion implantation, and a N-type drain 11b is formed on a side of the reading transistor 3 and on the other side of the P-type semiconductor substrate 5 close to the bottom insulating dielectric layer 6 and opposite to the N-type source 11a by ion implantation. The light-sensing transistor 1 and the charge storage transistor 2 may be the same or different in area. A P-type heavily-doped region 12 is formed on the P-type semiconductor substrate below the charge storage transistor 2 by P+ ion implantation, to increase the full-well charge capacity, decrease the area of the charge storage transistor 2, increase the filling coefficient of pixels and isolate the electrons from the light-sensing transistor 1 from the electrons collected in the P-type semiconductor substrate 5.

In the global-shutter photosensitive detector, the bottom insulating dielectric layer 6 is made from silicon oxide, SiON or other dielectrics with a high dielectric constant, and has a thickness of about 10 nm; the top insulating dielectric layer 8 is made from silicon nitride/silicon oxide/silicon nitride, silicon oxide/aluminum oxide/silicon oxide, silicon oxide, aluminum oxide or other dielectrics with a high dielectric constant, and has an equivalent silicon oxide thickness of 10 nm to 15 nm; the charge coupled layer 7 is made from polysilicon, metal or other conducting materials, and the thickness of the polysilicon is generally 100 nm;

and, the control gate 9 is made from polysilicon or other transparent conducting materials. At least one of the substrate of the light-sensing transistor 1 and the dielectric layer above the substrate is a transparent or semitransparent window for a wavelength of light to be detected. In this embodiment, a transparent or semitransparent window for a wavelength of light to be detected by the detector begins from the bottom insulating dielectric layer 6 upward to the control gate 9. To improve the quantum efficiency of the detector, the top insulating dielectric layer 8 and the charge coupled layer 7 above the light-sensing transistor can be removed, and the control gate 9 is directly formed above the bottom insulating dielectric layer 6. To improve the quantum efficiency of the photosensitive detector, another method is to remove the top insulating dielectric layer 8 and the charge coupled layer 7 above the substrate of the light-sensing transistor 1 and directly form the control gate 9 above the bottom insulating dielectric layer 6. This is to reduce the proportion of incident light absorbed by the dielectric layer above the substrate, particularly short-wavelength components in the incident light.

In this embodiment, the preparation process of the global-shutter photosensitive detector based on a composite dielectric gate MOSFET will be described below. Firstly, active regions are defined and a shallow trench isolation (STI) region 10 is formed. One pixel contains two active regions, i.e., an active region for the reading transistor 3 and an active region for the light-sensing transistor 1, the charge transfer transistor 4 and the charge storage transistor 2. The two active regions are isolated by the shallow trench isolation (STI) region 10. Then, MOSFET units are constructed. The bottom insulating dielectric layers 6, charge coupled layers 7, top insulating dielectric layers 8, control gates 9 and source-drain regions (11a, 11b) of transistors are mainly formed. The final process includes the fabrication of metal interconnection lines, the fabrication of the passivation layer and the planarization of the wafer surface.

In this embodiment, the photoelectronic signal detection, photoelectron collection, and photoelectron transfer and storage by the global-shutter photosensitive detector based on a composite dielectric gate MOSFET will be described below.

Photoelectron Collection:

A suitable positive bias pulse is applied between the control gate of the light-sensing transistor 1 and the substrate, and a depletion region is formed on the surface of the P-type semiconductor substrate 5. The depth of the depletion region may be adjusted by the magnitude of the positive bias pulse. When the energy of the incident photoelectrons is greater than the energy gap of the semiconductor material (silicon), the incident light is excited in the P-type semiconductor to generate an electron-hole pair. The electron-hole pair in the depletion region is separated due to the electric field in the depletion region. The photoelectron is collected at boundaries of the P-type semiconductor substrate and the bottom insulating dielectric later, and the hole is repelled to the substrate.

Figure 7:
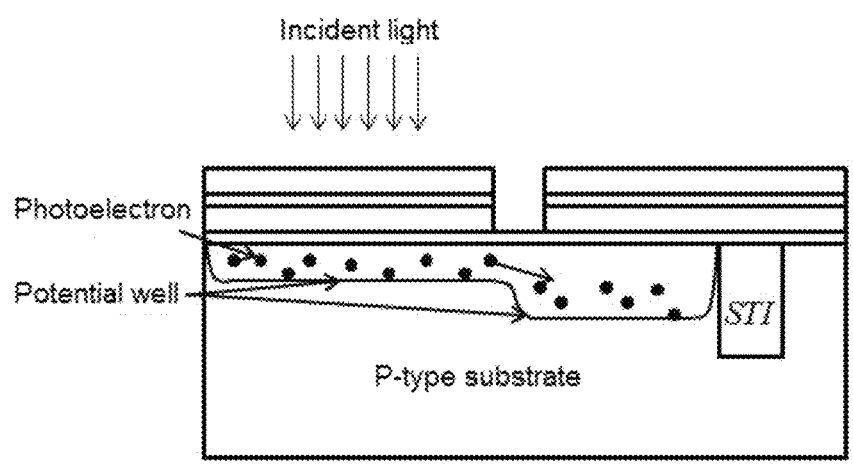
FIG. 7 is a schematic view of photoelectron transfer of the three-transistor global-shutter photosensitive detector.

Photoelectron Transfer and Storage:

As for the three-transistor (3T) global-shutter photosensitive detector: a positive bias that is greater than the voltage (2-5 V) applied onto the control gate of the light-sensing transistor 1 is applied to the control gate of the charge storage transistor 2, and photoelectrons in the depletion region of the light-sensing transistor 1 are transferred to the depletion region of the charge storage transistor 2 due to the mechanisms such as thermal diffusion, self-induced drifting and the fringe electric field, as shown in FIG. 7. At the end of transfer, a negative bias that is the same as the voltage applied to the P-type substrate is applied onto the control gate of the light-sensing transistor 1, so that the depletion region in the light-sensing transistor disappears and the photoelectron collection is stopped.

Figure 8:
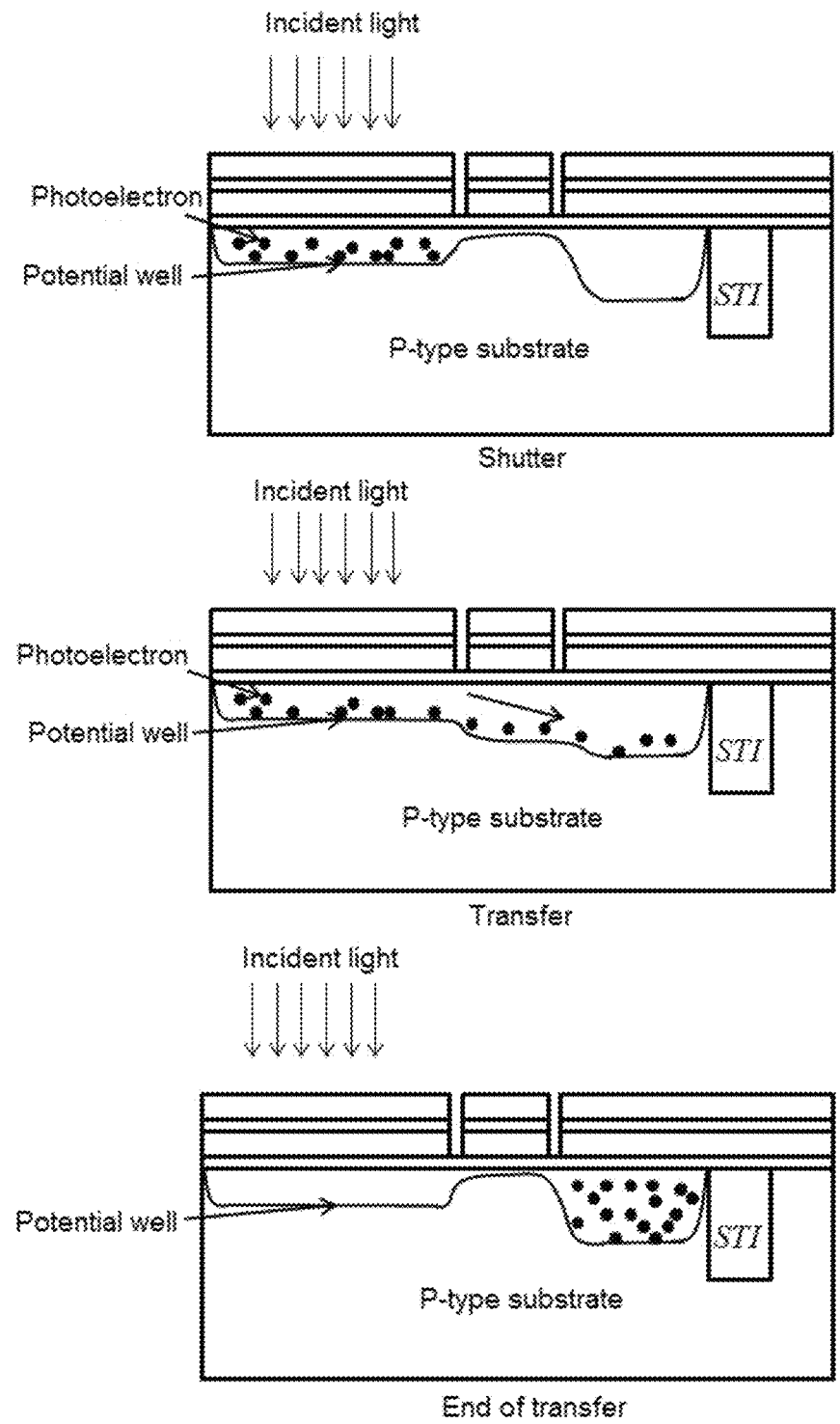
FIG. 8 is a schematic view of photoelectron transfer of the four-transistor global-shutter photosensitive detector.

As for the four-transistor (4T) global-shutter photosensitive detector: a positive bias that is greater than the voltage (2-5 V) applied to the control gate of the light-sensing transistor 1 is applied onto the control gate of the charge storage transistor 2, and a positive bias is applied onto the charge transfer transistor 4 so that the barrier height of the semiconductor substrate below the charge transfer transistor 4 is reduced. Thus, the electronic potential in the semiconductor substrate below the light-sensing transistor 1, the charge transfer transistor 4 and the charge storage transistor 2 is reduced gradually, and the photoelectrons are transferred from the light-sensing transistor 1 to the charge storage transistor 2, as shown in FIG. 8. At the end of transfer, the bias applied onto the control gate of the charge transfer transistor 4 is reduced, and the electronic potential in the substrate below the charge transfer transistor 4 is increased. In this case, the light-sensing transistor 1 can perform shutter for the next frame.

In this embodiment, the method for reading photoelectronic signals by the global-shutter photosensitive detector based on a composite dielectric gate MOSFET will be described below.

Firstly, the threshold voltage of the reading transistor in dark is obtained by scanning by the following method. A negative bias (−5 V to 0 V) is applied onto the substrate. The source 11a of the reading transistor 3 is connected to the ground, and a positive bias (0.1 V to 0.2 V) is applied onto the drain 11b. A scanning voltage of 0 V to 7 V is applied onto the control gate (shared by the charge storage transistor 2) above the reading transistor 3. When the source and the drain are turned on, the voltage applied to the control gate is considered as the threshold voltage $V_{th1}$ of the reading transistor 3. This value should be a constant value.

The photoelectrons stored in the depletion region of the charge storage transistor 2 are collected, and the potential of the charge coupled layer is affected by the principle of charge coupling. To maintain the photoelectrons in the depletion region, a positive bias (2 V to 7 V) is applied onto the control gate above the charge storage transistor 2. During reading, the source 11a of the reading transistor 3 is connected to the ground, and a positive bias (0.1 V to 0.2 V) is applied onto the drain 11b. In this case, the source and the drain of the reading transistor 3 are turned off, and a ramp voltage is applied onto the control gate (shared by the reading transistor) above the charge storage transistor 2. The initial value of the ramp voltage is equal to the value of the positive bias previously applied onto the charge storage transistor 2. The specific value of the change range (1 V to 2 V) of the ramp voltage is determined by the sensitivity of the device. In the process of rising the ramp voltage, the source and the drain of the reading transistor 3 are gradually turned on. The value of the ramp voltage when they are turned on is considered as the threshold voltage $V_{th2}$ of the reading transistor 3 after shutter.

Figure 9:
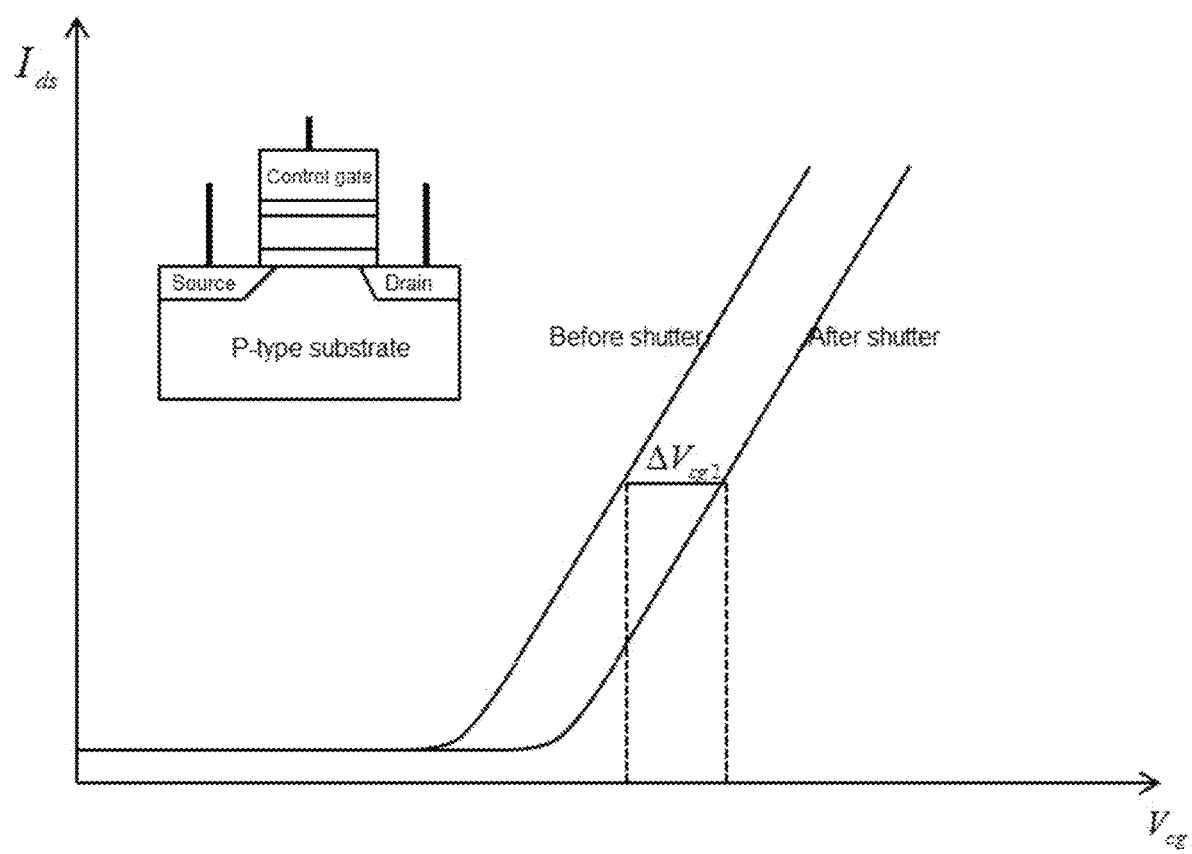
FIG. 9 is a schematic view of the change in threshold voltage of the reading transistor after photoelectron transfer.

The threshold voltage of the reading transistor 3 in dark is subtracted from the threshold voltage of the reading transistor 3 after shutter to obtain a change $\Delta V_{th}$ in the threshold voltage, as shown in FIG. 9. The number of photoelectrons stored in the depletion region of the charge storage transistor 2 can be calculated from this value.

Figure 10:
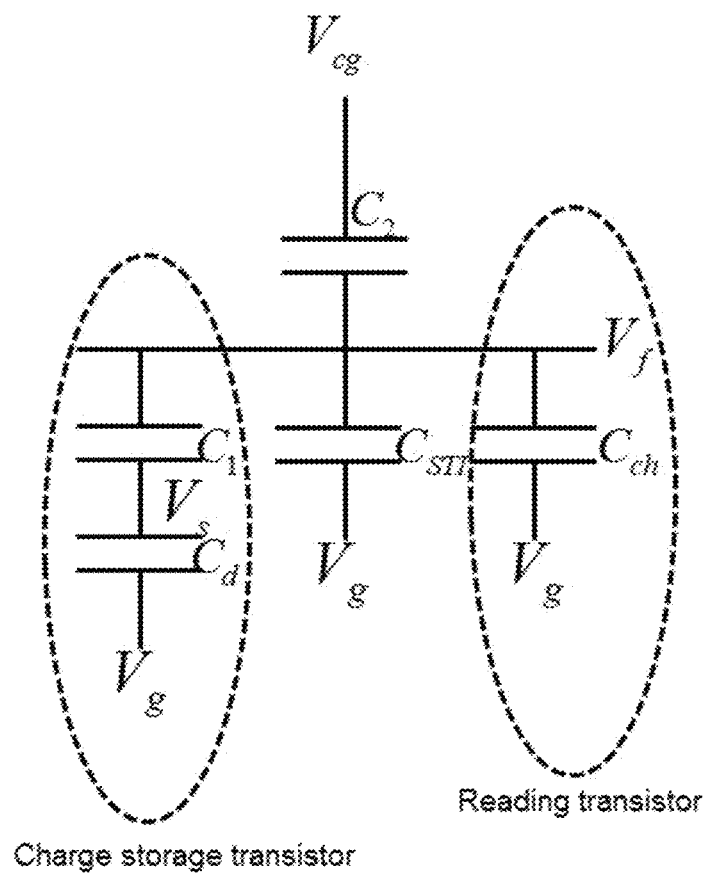
FIG. 10 is an equivalent capacitance model of a signal reading portion of the global-shutter photosensitive detector.

To improve the quantum efficiency of the photosensitive detector, one method is to increase the filling coefficient of pixels. To increase the filling coefficient without increasing the area of pixels, it is necessary to increase the area of the light receiving surface of the light-sensing transistor 1 and reduce the area of the charge storage transistor 2. To prevent incomplete charge transfer, it is necessary to ensure that the full-well charge capacity of the charge storage transistor 2 is greater than or equal to that of the light-sensing transistor 1. The full-well charge capacity of the charge storage transistor 2 can be increased by the following method: a P+ region 12 is formed in the P-type semiconductor substrate 5 of the charge storage transistor 2 by P+ ion implantation. In this way, the area of the light-sensing transistor 1 can be further increased. It is to be noted that, since the photosensitive detector reads the number of photoelectrons stored in the depletion region of the charge storage transistor 2 by charge coupling, it means that the decrease in the area of the charge storage transistor 2 will lower the sensitivity of the device. Since the change in the threshold voltage of the reading transistor 3 in the device depends on capacitances $C_1$, $C_2$ and $C_{ch}$, $C_1$ and $C_2$ decrease with the decrease in the area of the charge storage transistor 2, and the change in the threshold voltage together with $V_s$ also decreases, where $C_1$ represents the capacitance of the oxidation layer of the charge storage transistor, $C_2$ represents the capacitance between the charge storage layers and the control gates of the charge storage transistor and the reading transistor, and $C_{ch}$ represents the capacitance of the oxidation layer of the reading transistor. The equivalent capacitance of the reading portion is shown in FIG. 10.

Figure 11:
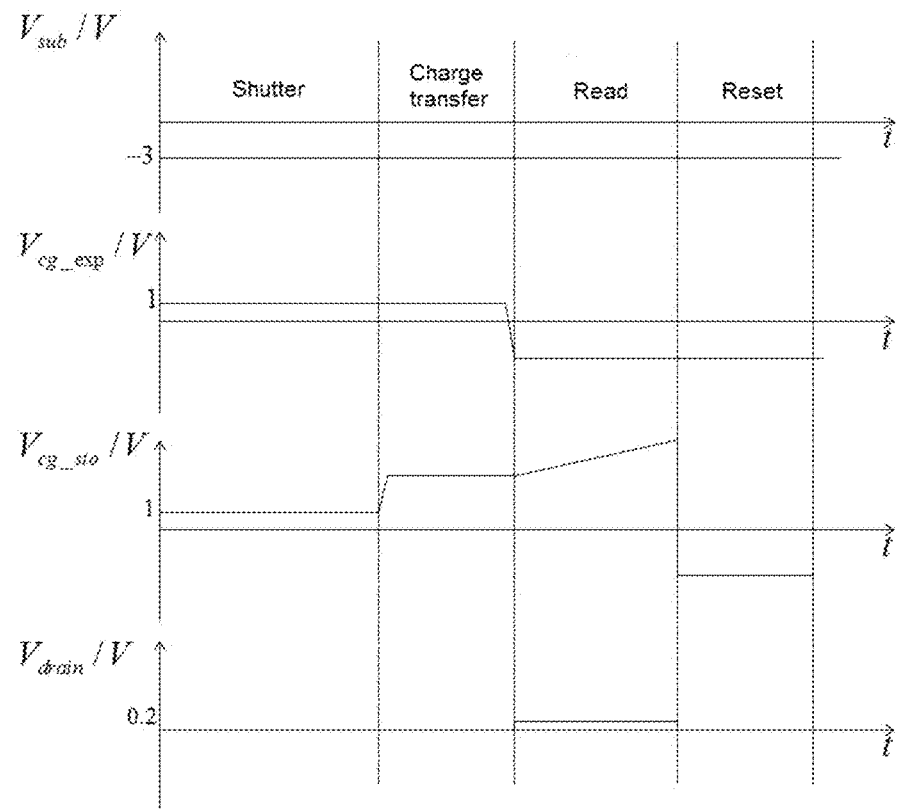
FIG. 11 is a sequence diagram of the operation of the three-transistor global-shutter photosensitive detector.

The photoelectric conversion process of the three-transistor (3T) global-shutter photosensitive detector will be described below. The sequence diagram of the operation of the device is shown in FIG. 11. During shutter, a negative bias pulse (−5 V to 0 V) is applied onto the P-type semiconductor substrate 5, and a positive bias pulse (0 V to 2 V) is applied onto the control gate cg_exp of the light-sensing transistor 1. In this way, a depletion region is formed on the substrate of the light-sensing transistor 1. When incident photons reach the depletion region and if the energy hv of photons is greater than the energy gap $E_g$ of the semiconductor, the incident photons are absorbed by the semiconductor and excited to generate an electron-hole pair. Since the depletion region has an electric field directed to the P-type semiconductor substrate 5 from the boundary between the P-type semiconductor substrate 5 and the bottom insulating dielectric layer 6, the electron-hole pair is separated, the electron is collected at the boundary, and the hole is repelled to the substrate. With the gathering of photoelectrons, the depth of the depletion region decreases.

The photoelectron transfer and storage process of the three-transistor (3T) global-shutter photosensitive detector will be described below. Since there is no charge transfer transistor 4 in the device, the charge storage transistor 2 functions to realize charge transfer. It can be found from the sequence diagram in FIG. 11 that a positive bias greater than cg_exp is applied onto the control gate cg_sto of the charge storage transistor 2 so that the potential of photoelectrons in the potential well of the charge storage transistor 2 is lower than that of photoelectrons in the light-sensing transistor 1, and the photoelectrons will be transferred to and stored in the depletion region of the charge storage transistor 2 due to mechanisms such as thermal diffusion, self-induced drifting and fringe electric field.

Figure 12:
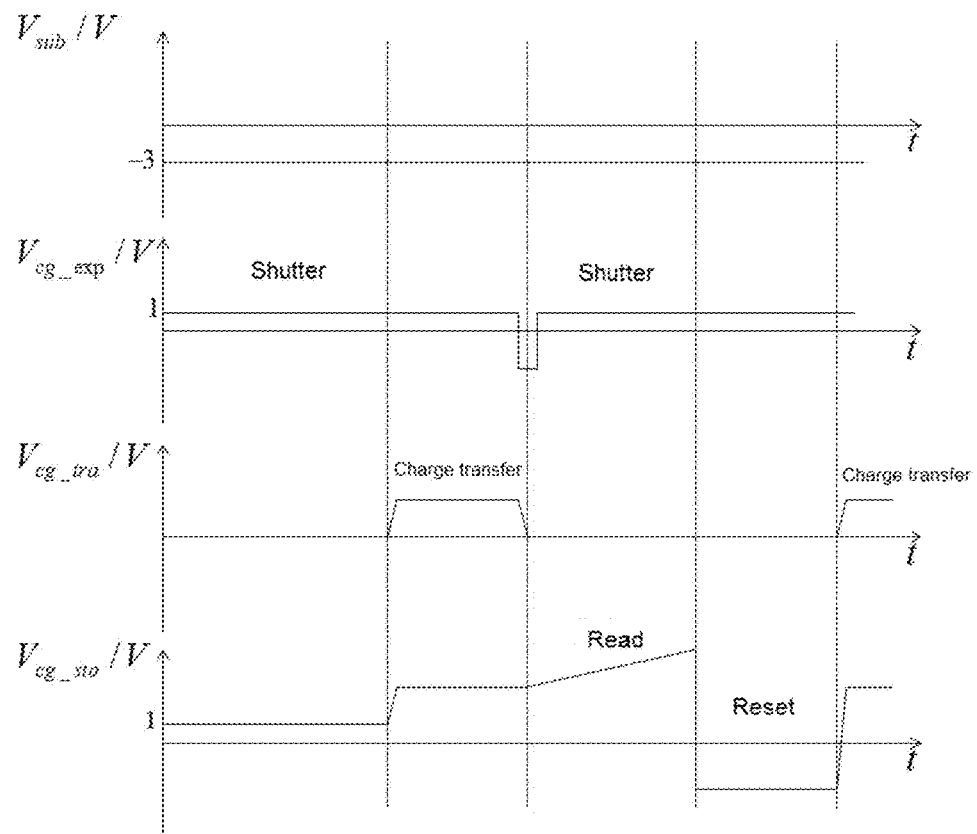
FIG. 12 is a sequence diagram of the operation of the four-transistor global-shutter photosensitive detector.

The photoelectron connection process of the four-transistor (4T) global-shutter photosensitive detector will be described below. The sequence diagram of the operation of the device is shown in FIG. 12. During shutter, a negative bias pulse (−5 V to 0 V) is applied onto the P-type semiconductor substrate 5, and a positive bias pulse (0 V to 2 V) is applied onto the control gate cg_exp of the light-sensing transistor 1. In this way, a depletion region is formed below the substrate of the light-sensing transistor 1. When incident photons reach the depletion region and if the energy hv of photons is greater than the energy gap $E_g$ of the semiconductor, the incident photons are absorbed by the semiconductor and excited to generate an electron-hole pair. Since the depletion region has an electric field directed to the P-type semiconductor substrate 5 from the boundary between the P-type semiconductor substrate 5 and the bottom insulating dielectric layer 6, the electron-hole pair is separated, the electron is collected at the boundary, and the hole is repelled to the substrate. With the gathering of photoelectrons, the depth of the depletion region decreases.

The photoelectron transfer process of the four-transistor (4T) global-shutter photosensitive detector will be described below. Since the charge transfer transistor 4 is additionally provided, the shutter and signal reading of the device can be performed simultaneously. During photoelectron transfer, a positive bias is applied onto the control gate cg_tra of the charge transfer transistor 4 and a positive bias greater than the applied cg_tra is applied onto the control gate cg_sto of the charge storage transistor 2, so that an electronic potential, which decreases stepwise, is generated in the substrate below the light-sensing transistor 1, the charge transfer transistor 4 and the charge storage transistor 2. As shown in FIG. 8, the photoelectrons are transferred to the depletion region on the charge storage transistor 2 side. At the end of transfer, a negative bias the same as that applied to the substrate is applied onto the control gate cg_tra of the charge transfer transistor 4, and the electronic potential below the charge transfer transistor 4 is increased. In this case, signal reading can be performed.

The photoelectron reading process will be described below. After the photoelectron transfer in the photosensitive detector is completed, it is unnecessary to transfer charge packets one by one as in the CCDs, and light signals are read in a way similar to the signal reading way used in the CMOS-APSs. A detection unit is selected. Since the photoelectrons are collected in the depletion region of the charge storage transistor 2, this part of charges affect the threshold voltage of the reading transistor 3 by changing the surface potential. Since the bottom insulating dielectric layer 6 having a thickness of 10 nm is used in the design and the difference in bias between gate liners is controlled within 8 V, the photoelectrons implanted into the charge coupled layer 7 by tunneling can be ignored. Therefore, the charge coupled layer 7 is always electrically neutral during the whole operation process.

As shown in FIG. 10, it is assumed that the potential of the charge coupled layer 2 of the charge storage transistor 2 is $V_f$, the surface potential of the substrate is $V_s$, the bias applied onto the control gate is $V_{cg}$, the capacitance between the charge coupled layer 7 and the surface of the charge storage transistor 2 is $C_1$, the capacitance of the depletion region of the charge storage transistor 2 is $C_d$, the capacitance between the charge coupled layer 7 and the control gate 9 is $C_2$, the capacitance above the STI region 10 is $C_{STI}$, and the capacitance of a channel between the charge coupled layer 7 and the reading transistor 3 is $C_{ch}$. For a node of the charge coupled layer 7, the influence from the electron implantation is ignored, and the quantity of charges in the charge coupled layer 7 is a constant $Q_f$, then:

$$(V_f - V_s)C_1 + (V_f - V_{cg})C_2 + (V_f - V_g)(C_{STI} + C_{ch}) = Q_f \qquad (1).$$

Since both $V_{cg}$ and $V_g$ are constants during shutter, derivation is performed on the left and right sides of the above formula to obtain:

$$\Delta V_s = \frac{1}{C_1}(C_1 + C_2 + C_{STI} + C_{ch})\Delta V_f. \quad (2)$$

For a node where $V_s$ is located, if it is assumed that the number of the stored photoelectrons is Q, then:

$$C_d(V_s - V_g) + C_1(V_s - V_f) = Q \quad (3).$$

Derivation is performed on the left and right sides of the above formula to obtain:

$$\Delta Q = (C_d + C_1)\Delta V_s - C_1 \Delta V_f \quad (4).$$

The formula (4) is substituted into the formula (2) to obtain:

$$\Delta Q = \frac{C_d}{C_1}(C_1 + C_2 + C_{STI} + C_{ch})\Delta V_f + (C_2 + C_{STI} + C_{ch})\Delta V_f. \quad (5)$$

If it is assumed that $$C = \frac{C_d}{C_1}(C_1 + C_2 + C_{STI} + C_{ch}) + (C_2 + C_{STI} + C_{ch}), \text{ then:} \quad (6)$$

$$\Delta V_f = \frac{\Delta Q}{C}.$$

The relationship between the change in potential of the charge coupled layers 7 of the charge storage transistor 2 and the reading transistor 3 and the number of photoelectrons in the depletion region of the charge storage transistor 2 is established in the above formula. To improve the operating sensitivity of the device, it is required to decrease the value of C. Therefore, it is required to increase $C_1$ or decrease $C_2$, $C_{STI}$, $C_{ch}$ and $C_d$. The $C_1$ can be increased by reducing the thickness of the bottom insulating dielectric layer 6 of the charge storage transistor 2, increasing the area of the charge storage transistor 2 or using a dielectric material with a higher dielectric constant. However, since increasing the area of the charge storage transistor 2 is at the cost of decreasing the filling coefficient of pixels, the sensitivity of the device cannot be improved by simply increasing the area of the charge storage transistor 2. The $C_{ch}$ can be decreased by increasing the thickness of the bottom insulating dielectric layer above the reading transistor 3 or decreasing the area of the gate of the reading transistor 3. The $C_2$ can be decreased by increasing the thickness of the top insulating dielectric layer 8.

Thus, the change $\Delta V_f$ in the potential of the charge coupled layers 7 of the charge storage transistor 2 and the reading transistor 3 is obtained. Since the change in voltage is considered from the view of the charge coupled layer 7 and the voltage is applied onto the control gates of the charge storage transistors 2 and the reading transistor 3 during the measurement of the threshold voltage of the device, it is required to convert the change in potential of the charge coupled layer 7 into the change in bias on the control gate. The conversion formula is shown by the following formula (7).

$$\Delta V_{cg} = \frac{C_1 + C_2}{C_2}\Delta V_f. \quad (7)$$

From the above formula, the number of photoelectrons can be calculated by measuring $\Delta V_{cg}$. To obtain $\Delta V_{cg}$, the threshold voltage of the reading transistor 3 in dark can be obtained by direct scanning, denoted by $V_{cg1}$; and, the threshold voltage of the reading transistor 3 after shutter is obtained by scanning the ramp voltage by the following method. Since $V_{cg2}$ is applied onto the control gate in advance, the initial value of the ramp voltage is set as $V_{cg2}$. It is to be noted that the voltage value cannot be greater than the threshold voltage of the reading transistor 3 (the control gate is shared by the reading transistor and the charge storage transistor. The ramp voltage gradually increases from $V_{cg2}$. After the ramp voltage reaches $V_{cg2}+\Delta V$, the reading transistor 3 is turned on. Thus, $V_{cg2}+\Delta V - V_{cg1}$ is the change $\Delta V_{cg}$ in the threshold voltage of the reading transistor 3 before and after shutter.

The resetting process will be described below. When a suitable negative bias (which is the same as or slightly lower than the negative bias applied to the substrate) is applied onto the control gates of the light-sensing transistor 1, the charge transfer transistor 4 and the charge control transistor 2, the source 11a and the drain 11b of the reading transistor 3 are connected to the ground, the photoelectrons accumulated in the depletion region gradually decrease until they disappear by recombination.

An array formed of multiple detection units forms a framework of an array of detectors.

Figure 13:
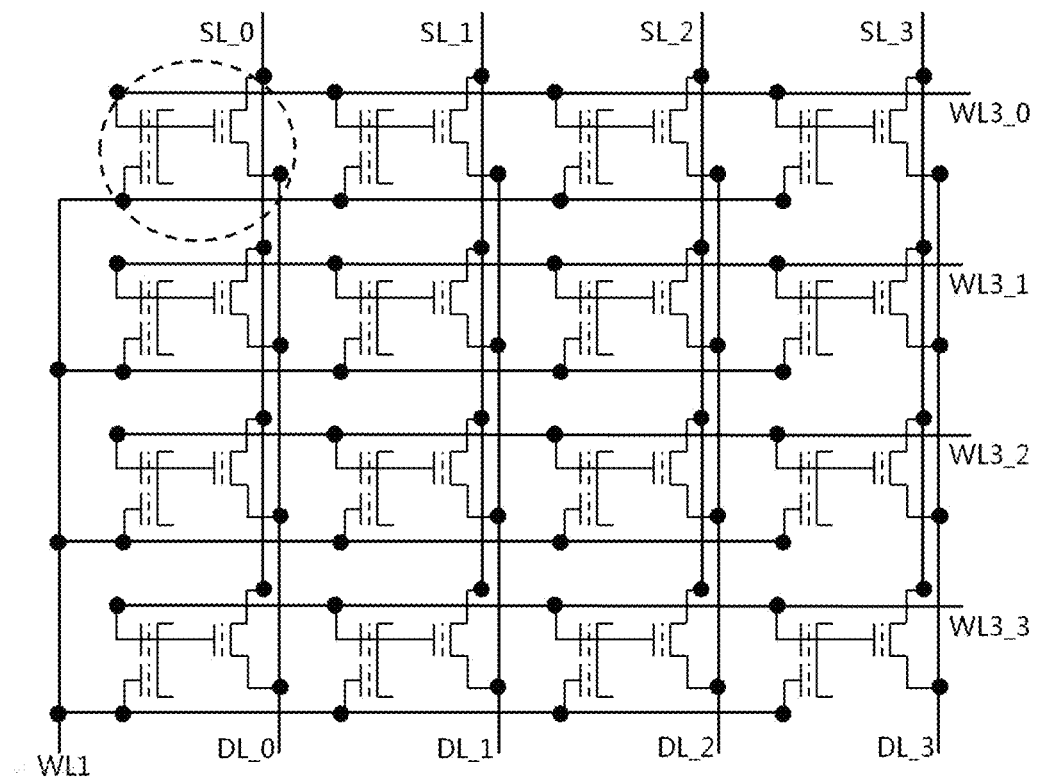
FIG. 13 is a schematic view of an interconnection structure of an array of three-transistor global-shutter photosensitive detectors.

FIG. 13 shows an equivalent circuit diagram of an array of three-transistor (3T) global-shutter photosensitive detectors, where the dashed box shows a detection unit. The control gates of the light-sensing transistors in each detection unit in the detection array are connected to form a word line WL1; the control gates shared by the reading transistors and the charge storage transistors in each row of detection units are connected to form a word line WL3_X (where X=0, 1, 2, 3 . . . N); the sources of the reading transistors in each column of detection units are connected to form a source line SL_X (where X=0, 1, 2, 3 . . . N); and, the drains of the reading transistors in each column of detection units are connected to form a drain line DL_X (where X=0, 1, 2, 3 . . . N).

Figure 14:
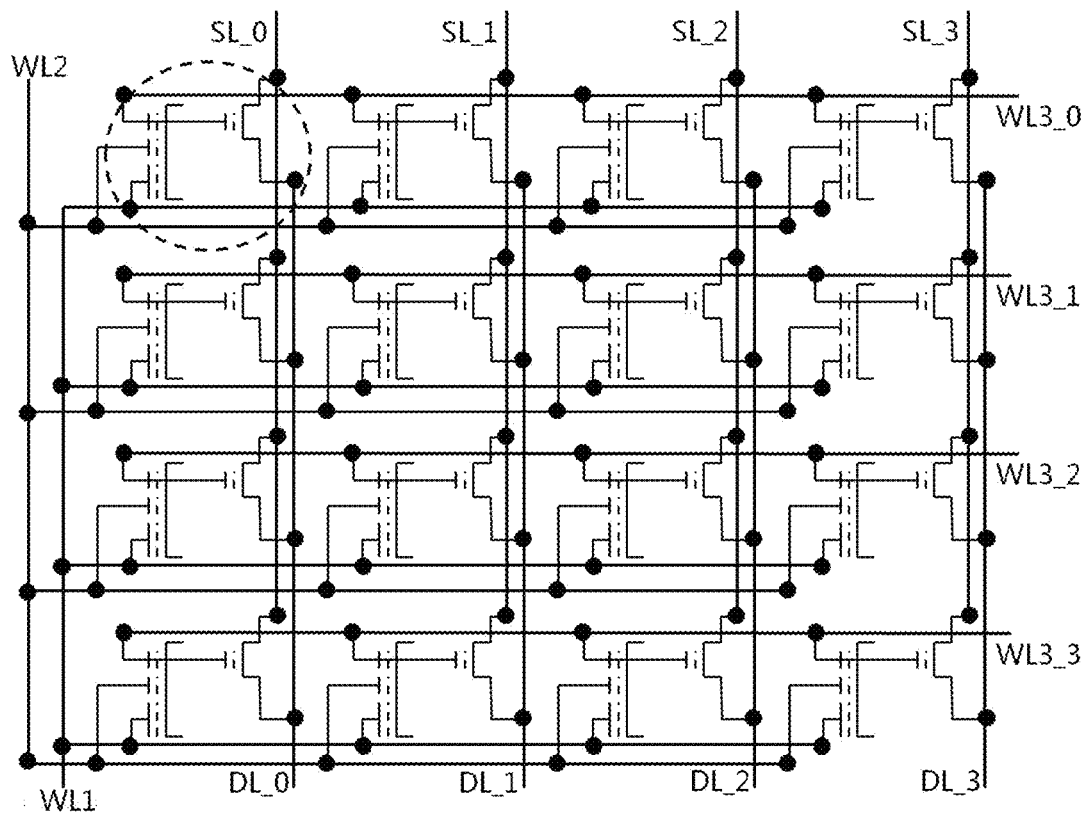
FIG. 14 is a schematic view of an interconnection structure of an array of four-transistor global-shutter photosensitive detectors.
Figure 15:
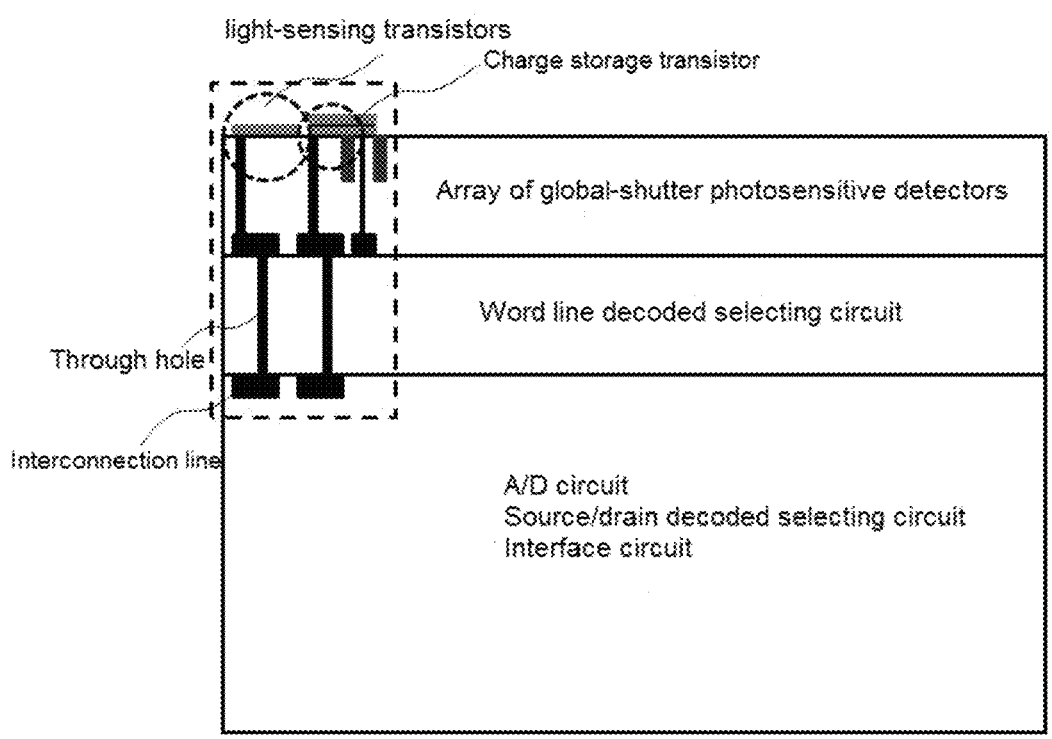
FIG. 15 is a schematic view of a 3D imaging sensor chip formed of global-shutter photosensitive detectors.

FIG. 14 shows an equivalent circuit diagram of an array of four-transistor (4T) global-shutter photosensitive detectors, where the dashed box shows a detection unit. The control gates of the light-sensing transistors in each detection unit in the detection array are connected to form a word line WL1; the control gates of the charge transfer transistors in each detection unit are connected to form a WL2; the control gates shared by the reading transistors and the charge storage transistors in each row of detection units are connected to form a word line WL3_X (where X=0, 1, 2, 3 . . . N); the sources of the reading transistors in each column of detection units are connected to form a source line SL_X (where X=0, 1, 2, 3 . . . N); and, the drains of the reading transistors in each column of detection units are connected to form a drain line DL_X (where X=0, 1, 2, 3 . . . N).

In this embodiment, by taking the four-transistor global-shutter photosensitive detector as an example, an shutter imaging method is provided. The specific steps will be described below.

Photoelectron collection: a negative bias is applied onto the substrate of the array of photosensitive detectors, a positive bias is applied onto the word line WL1, a negative bias is applied onto the word line WL2, a zero bias or positive bias is applied onto the word line WL3_X (where X=0, 1, 2, 3 . . . N) in each row, and all the source lines SL_X (where X=0, 1, 2, 3 . . . N) and the drain lines DL_X (where X=0, 1, 2, 3 . . . N) are connected to the ground.

Photoelectron transfer and storage: a positive bias is applied onto the word line WL2 and the word line WL3_X (where X=0, 1, 2, 3 . . . N) in each row; a negative bias is applied onto the word line WL1 and the word line WL2 at the end of photoelectron transfer; and, all the source lines SL_X (where X=0, 1, 2, 3 . . . N) and the drain lines DL_X (where X=0, 1, 2, 3 . . . N) are connected to the ground.

Photoelectron reading: the bias applied onto the substrate, the word line WL1 and the word line WL2 is maintained, the source line SL_X (where X=0, 1, 2, 3 . . . N) in the column where the detector to be read is located is connected to the ground, a positive bias is applied onto the drain line DL_X (where X=0, 1, 2, 3 . . . N), and a ramp voltage is applied onto the word line WL3_X (where X=0, 1, 2, 3 . . . N) in the row where the detector is to be read is located.

Resetting: a negative bias the same as that applied to the substrate is applied onto the word line WL1 and the word line WL2, a negative bias the same as that applied to the substrate is applied onto the word line WL3_X (where X=0, 1, 2, 3 . . . N) in each row, and all the source lines SL_X (where X=0, 1, 2, 3 . . . N) and the drain lines DL_X (where X=0, 1, 2, 3 . . . N) are connected to the ground.

This embodiment further provides an imaging sensor chip.

The imaging sensor chip includes an array of global-shutter photosensitive detectors based on a composite dielectric gate MOSFET (by taking a four-transistor structure as an example), a word line decoded addressing circuit, a source line/drain line decoded addressing circuit, an A/D circuit and an interface circuit. The word line decoded addressing circuit is configured to generate, according to a reading order, different bias signals for a word line WL1, a word line WL2 and a word line WL3_X (where X=0, 1, 2, 3 . . . N) in shutter, transfer, read and reset stages. The bias signals can be provided on chip or off chip. The source line/drain line decoded addressing circuit is configured to strobe, according to the reading order, a source and a drain of a reading transistor of a photosensitive detector, to facilitate the subsequent conversion of photoelectronic signals by the A/D circuit. The A/D circuit is configured to convert a photoelectronic signal in the photosensitive detector into a digital signal. The interface circuit is configured to transmit, under the control of a clock signal, the converted digital signal to the outside of the imaging sensor chip.

The imaging sensor chip can form a stacked imaging sensor chip by 3D stacking. The imaging sensor chip is of a three-layer structure. As shown in FIG. 5, the top layer is a light-sensing array formed of photosensitive detectors, the middle layer is a word line decoded selecting circuit, the bottom layer includes an A/D circuit, a source/drain decoded selecting circuit and an interface circuit, and the layers are interconnected by an interconnection process.

The invention claimed is:

1. A global-shutter photosensitive detector based on a composite dielectric gate MOSFET, comprising an array formed of multiple detection units, characterized in that each detection unit comprises a light-sensing transistor, a charge storage transistor and a reading transistor, all of which are stacked above a same P-type semiconductor substrate;

the light-sensing transistor is configured to realize the light-sensing function of the photosensitive detector, having a bottom insulating dielectric layer, a charge coupled layer, a top insulating dielectric layer and a control gate stacked above the P-type semiconductor substrate successively from the bottom up, or, a bottom insulating dielectric layer and a control gate stacked above the P-type semiconductor substrate successively from the bottom up;

the charge storage transistor is configured to store photogenerated charges, having a bottom insulating dielectric layer, a charge coupled layer, a top insulating dielectric layer and a control gate stacked above the P-type semiconductor substrate successively from the bottom up;

the reading transistor is configured to read a signal, having a bottom insulating dielectric layer, a charge coupled layer, a top insulating dielectric layer and a control gate stacked above the P-type semiconductor substrate successively from the bottom up, a N-type source is formed on a side of the P-type semiconductor substrate close to the bottom insulating dielectric layer by ion implantation, and a N-type drain is formed on the other side of the P-type semiconductor substrate close to the bottom insulating dielectric layer and opposite to the N-type source by ion implantation;

the charge storage transistor and the reading transistor are isolated by a shallow trench isolation region in the substrate;

the charge coupled layer of the light-sensing transistor is not in connection to the charge coupled layer of the charge storage transistor, and the control gate of the light-sensing transistor is not in connection to the control gate of the charge storage transistor; and the charge coupled layer of the charge storage transistor is in connection to the charge coupled layer of the reading transistor, and the control gate of the charge storage transistor is in connection to the control gate of the reading transistor.

2. The global-shutter photosensitive detector based on a composite dielectric gate MOSFET according to claim 1, characterized in that a charge transfer transistor is arranged between the light-sensing transistor and the charge storage transistor to control the transfer of the photogenerated charges; the charge transfer transistor is formed above the P-type semiconductor substrate and has a bottom insulating dielectric layer, a charge coupled layer, a top insulating dielectric layer and a control gate stacked successively from the bottom up; the charge coupled layer of the charge transfer transistor is not in connection to both the charge coupled layer of the light-sensing transistor and the charge coupled layer of the charge storage transistor, and the control gate of the charge transfer transistor is not in connection to both the control gate of the light-sensing transistor and the control gate of the charge storage transistor.

3. The global-shutter photosensitive detector based on a composite dielectric gate MOSFET according to claim 1, characterized in that at least one of the control gate surface and the substrate of the light-sensing transistor is a transparent or semitransparent window for a wavelength of light to be detected by the detector.

4. The global-shutter photosensitive detector based on a composite dielectric gate MOSFET according to claim 1, characterized in that a P+ region is formed on the substrate of the charge storage transistor by doping by ion-implantation.

5. The global-shutter photosensitive detector based on a composite dielectric gate MOSFET according to claim 1, characterized in that the charge coupled layer is made from polysilicon, metal or semiconductor material; the control gate is made from polysilicon, metal or transparent conducting electrodes; the bottom insulating dielectric layer is made from silicon oxide or SiON; the top insulating dielectric layer is made from silicon nitride/silicon oxide/silicon nitride, silicon oxide/aluminum oxide/silicon oxide, silicon oxide or aluminum oxide.

6. The global-shutter photosensitive detector based on a composite dielectric gate MOSFET according to claim 1, characterized in that, in the array formed of multiple detection units, the control gates of the light-sensing transistors in all the detection units are connected to form a word line WL1; the control gates shared by the reading transistors and the charge storage transistors in each row of detection units are connected to form a word line WL3_X; the sources of the reading transistors in each column of detection units are connected to form a source line SL_X; and the drains of the reading transistors in each column of detection units are connected to form a drain line DL_X, where X=0, 1, 2, 3 . . . N.

7. The global-shutter photosensitive detector based on a composite dielectric gate MOSFET according to claim 2, characterized in that, in the array formed of multiple detection units, the control gates of the light-sensing transistors in all the detection units are connected to form a word line WL1; the control gates of the charge transfer transistors in all the detection units are connected to form a word line WL2; the control gates shared by the reading transistors and the charge storage transistors in each row of detection units are connected to form a word line WL3_X; the sources of the reading transistors in each column of detection units are connected to form a source line SL_X; and the drains of the reading transistors in each column of detection units are connected to form a drain line DL_X, where X=0, 1, 2, 3 . . . N.

8. An imaging sensor chip formed using the global-shutter photosensitive detector based on a composite dielectric gate MOSFET according to claim 6, comprising an array of detectors, a word line decoded addressing circuit, a source line/drain line decoded addressing circuit, an A/D circuit and an interface circuit;
the word line decoded addressing circuit is configured to generate, according to a reading order, different bias signals for each word line in shutter, transfer, read and reset stages of a detector;
the source line/drain line decoded addressing circuit is configured to strobe, according to the reading order, a source and a drain of a reading transistor of a detector;
the A/D circuit is configured to convert a photoelectronic signal in a photosensitive detector into a digital signal; and
the interface circuit is configured to transmit, under the control of a clock signal, the converted digital signal to the outside of the imaging sensor chip.

9. A detection method using the global-shutter photosensitive detector based on a composite dielectric gate MOSFET according to claim 1, comprising following steps:
(1) photoelectron collection: applying a positive bias onto a control gate of a light-sensing transistor and a negative bias onto a substrate, and applying a zero bias or positive bias onto a control gate of a charge storage transistor; and connecting a source and a drain of a reading transistor to the ground;
(2) photoelectron transfer and storage: maintaining the positive bias applied onto the control gate of the light-sensing transistor, and applying a positive bias onto the control gate of the charge storage transistor, wherein the positive bias is greater than the positive bias applied onto the control gate of the light-sensing transistor so that photoelectrons collected in a depletion region of the light-sensing transistor are completely transferred to a depletion region of the charge storage transistor; at the end of the transfer of the photoelectrons, applying, onto the control gate of the light-sensing transistor, a negative bias that is the same as that applied to the substrate, so that there is no depletion region in the light-sensing transistor and no photoelectron is collected;
(3) photoelectron reading: connecting the source of the reading transistor to the ground, applying a proper positive bias onto the drain, applying a ramp voltage onto the control gate of the reading transistor, and calculating the number of photoelectrons collected in the light-sensing transistor according to the change in the ramp voltage when the reading transistor is turned on; and
(4) resetting: applying, onto the control gate of the light-sensing transistor and the control gate of the charge storage transistor, a negative bias that is the same as that applied to the substrate, and connecting the source and the drain of the reading transistor to the ground, so that the photoelectrons disappear by recombination of photoelectrons and holes.

10. A detection method using the global-shutter photosensitive detector based on a composite dielectric gate MOSFET according to claim 2, comprising following steps:
(1) photoelectron collection: applying a positive bias onto a control gate of a light-sensing transistor and a negative bias onto a substrate, and forming a depletion region on a P-type substrate to collect photoelectrons; applying a negative bias onto a control gate of a charge transfer transistor, and applying a zero bias or positive bias onto a control gate of a charge storage transistor; and connecting a source and a drain of a reading transistor to the ground;
(2) photoelectron transfer and storage: maintaining the positive bias applied onto the control gate of the light-sensing transistor, applying a positive bias onto the control gate of the charge transfer transistor, applying a positive bias onto the control gate of the charge storage transistor, so that the electronic potential in a substrate below the light-sensing transistor, the charge transfer transistor and the charge storage transistor decreases progressively and photoelectrons collected in a depletion region of the light-sensing transistor are completely transferred to a depletion region of the charge storage transistor; at the end of the transfer of the photoelectrons, applying a negative bias onto the control gate of the charge transfer transistor, and applying, onto the control gate of the light-sensing transistor, a negative bias that is the same as that applied to the substrate, so that there is no depletion region in the light-sensing transistor and no photoelectron is collected;
(3) photoelectron reading: connecting the source of the reading transistor to the ground, applying a proper positive bias onto the drain, applying a ramp voltage onto the control gate of the reading transistor, and calculating the number of photoelectrons collected in the light-sensing transistor according to the change in the ramp voltage when the reading transistor is turned on; and
(4) resetting: applying, onto the control gate of the light-sensing transistor, the control gate of the charge transfer transistor and the control gate of the charge storage transistor, a negative bias that is the same as that applied to the substrate, and connecting the source and the drain of the reading transistor to the ground, so that the photoelectrons disappear by recombination of photoelectrons and holes.

* * * * *